United States Patent [19]

Tsividis

[11] 4,213,098

[45] Jul. 15, 1980

[54] SEMICONDUCTOR DIFFERENTIAL AMPLIFIER HAVING FEEDBACK BIAS CONTROL FOR STABILIZATION

[75] Inventor: Yannis Tsividis, New York, N.Y.

[73] Assignee: Bell Telephone Laboratories, Incorporated, Murray Hill, N.J.

[21] Appl. No.: 10,737

[22] Filed: Feb. 9, 1979

[51] Int. Cl.$^2$ ............................ H03F 3/45; H03F 3/16
[52] U.S. Cl. .................................... 330/253; 330/258; 330/259
[58] Field of Search ...................... 330/253, 258, 259

[56] References Cited

PUBLICATIONS

Hosticka et al., "MOS Sampled Data Recursive Filters Using Switched Capacitor Integrators", *IEEE Journal of Solid-State Circuits*, vol. SC-12, No. 6, Dec. 1977, pp. 600-608.

Tsividis, "Design Considerations in Single-Channel MOS Analog Integrated Circuits-A Tutorial", *IEEE Journal of Solid-State Circuits*, vol. SC-13, No. 3, Jun. 1978, pp. 383-391.

*Primary Examiner*—James B. Mullins
*Attorney, Agent, or Firm*—David I. Caplan

[57] ABSTRACT

An MOS differential amplifier includes a pair of substantially identical branches, each branch having a signal input MOS transistor feeding a separate MOS load transistor. Both branches are supplied current by a single current-source MOS transistor. In order to stabilize the (source-to-drain) bias voltages of the signal input and load transistors against fluctuations caused by semiconductor wafer-to-wafer processing variations, an auxiliary amplifier branch is added (for sensing the bias voltage) together with a feedback loop to the current-source (for controlling the current in response to the sensing of the bias voltage).

15 Claims, 3 Drawing Figures

SEMICONDUCTOR DIFFERENTIAL AMPLIFIER HAVING FEEDBACK BIAS CONTROL FOR STABILIZATION

FIELD OF INVENTION

This invention relates to the field of semiconductor apparatus and more particularly to MOS (metal-oxide-semiconductor) differential amplifier circuits.

BACKGROUND OF THE INVENTION

In the prior art, operational amplifiers in integrated circuit MOS technology, such as described in a paper by B. J. Hosticka, *IEEE Journal of Solid-State Circuits*, Vol. SC-12, pp. 600-608, at p. 605, FIG. 6 (1977), have used depletion mode MOS transistors as load devices in conjunction with enhancement mode MOS transistors used as signal processing and current-source (driver) devices, in order to achieve relatively high gain. Such amplifiers are useful in a variety of analog signal contexts, but they suffer from such problems as insufficient gain, arising from threshold voltage variations in the depletion mode transistors in one semiconductor wafer relative to another, caused by such factors as unintentional wafer-to-wafer variations in semiconductor processing parameters, as well as from intentional process modifications. Consequently, these MOS amplifiers suffer from improper bias of both load and signal detecting transistors in the input stage, thereby taking the operation out of the desired transistor saturation region where gain is relatively high.

This problem in the prior art may be better appreciated from a brief discussion of the typical differential amplifier input stage of the prior art (FIG. 1). Semiconductor processing variations result in corresponding variations in the threshold voltages of the substantially identical depletion mode load transistors ($M_5$, $M_7$) from the proper value suitable for preserving the desired high incremental resistance in the circuit. Specifically, if in N-MOS (N-channel MOS) technology the threshold voltages of these load transistors are too high, then the DC resistance of these load transistors will also be too high, that is, they will be operating with too large a voltage drop; therefore, since enhancement mode transistor $M_{10}$ acts as an electrical current-source, the voltage drop across the substantially identical enhancement mode signal input transistors ($M_1$, $M_3$) will be too low and these signal input transistors will not be operating in saturation, thereby reducing their operating transconductances $g_m$; hence, the gain of the stage will be undesirably low. On the other hand, if the threshold voltages of these load resistors ($M_5$, $M_7$) are too low, then their DC resistances will be too low and hence their operating voltage drops will be too low, so that they will not be operating in the saturation region, thereby reducing their incremental resistance; therefore, since gain is equal to the product of the incremental resistance of these load transistors and the transconductance of the signal input transistors, the gain of the stage will again be undesirably low. Accordingly, unless the threshold voltages of load transistors are tailored with sufficient precision to provide just the desired voltage drops for a given current-source, the biasing of the amplifier will not be suitable for achieving the desired high gain; however, such precision of processing control over threshold voltage is difficult, if at all possible to achieve even in present-day processing technology. Likewise, variations in supply voltages can similarly deteriorate the amplifier gain. Accordingly, it would be desirable to have an MOS amplifier circuit which does not require such precise control over the processing parameters and supply voltages.

SUMMARY OF THE INVENTION

An MOS amplifier circuit is designed with a self-biasing stabilized differential amplifier input stage that eliminates the need for precise matching of the threshold voltage of the depletion load transistors with the threshold voltage of the current-source transistor. In accordance with the invention, in a differential amplifier circuit stage in which each of the input signal transistors ($M_1$, $M_3$) drives a separate load transistor ($M_5$, $M_7$), each such input signal transistor is furnished with a separate corresponding auxiliary input transistor ($M_2$, $M_4$). The gate electrode of each input transistor is connected to the same input signal terminal as its corresponding auxiliary input signal transistor; the sources of both input signal transistors and both auxiliary input signal transistors are connected to an MOS transistor ($M_{10}$) acting as a common electrical current-source device; and the drains of the auxiliary input signal transistors are connected together through a common-mode feedback node (14) to an auxiliary load transistor ($M_6$). The common-mode feedback node 14 is connected to a feedback loop including an MOS transistor ($M_8$) which controls the current-source transistor ($M_{10}$).

Typically, the load transistors ($M_5$, $M_6$, $M_7$) are depletion mode N-MOS transistors (indicated in FIG. 1 by their dotted line channels), whereas the other transistors are enhancement mode N-MOS transistors.

If the parameters of the various transistors are properly selected, as set forth below, then during operation, in response to the voltage at the node 14 the feedback provided by the transistor $M_8$ to the control terminal (gate electrode) of the common electrical current source device $M_{10}$ will stabilize the source-drain bias voltage both of the load transistors ($M_5$, $M_7$) and of the input signal transistors ($M_1$, $M_3$) against fluctuations in the threshold voltages of these transistors.

The parameters of the auxiliary input signal transistors and of the load transistors are selected such that the common-mode current in each of the input signal transistors is equal to the combined current in the two auxiliary input signal transistors. Specifically, introducing the beta's, $\beta_1$, $\beta_2$, $\beta_3$, ... $\beta_7$ of the transistors $M_1$, $M_2$, $M_3$, ... $M_7$, with $\beta$ for each transistor defined by the well-known relationship for the saturation current, $I_{SAT} = \beta(V_G - V_T)^2$, where $V_G$ is the gate voltage and $V_T$ is the threshold voltage of the transistor; these $\beta$'s advantageously satisfy the relationships $$\text{beta}_1 : \beta_3 : (\beta_2 + \beta_4) = \beta_5 : \beta_7 : \beta_6 \tag{1}$$

A convenient way of satisfying these relationships is to make the load transistors $M_5$, $M_6$, and $M_7$ all substantially identical to one another ($\beta_5 = \beta_6 = \beta_7$) while making the input signal transistors $M_1$ and $M_3$ also substantially identical to each other ($\beta_1 = \beta_3$), and while making the channel widths of both of the auxiliary input signal transistors $M_2$ and $M_4$ substantially equal to one-half the channel width of $M_1$ (but otherwise substantially identical to $M_1$), so that:

$$\beta_1 = \beta_3 = 2\beta_2 = 2\beta_4; \quad \beta_5 = \beta_6 = \beta_7 \tag{2}$$

Accordingly, this invention involves a differential amplifier circuit in MOS technology including a pair of substantially identical branches, each branch having a separate signal input MOS transistor ($M_1$, $M_3$) in series with a separate MOS load transistor ($M_5$, $M_7$), both branches being connected to the drain of a common current-source MOS transistor ($M_{10}$), CHARACTERIZED IN THAT said circuit further includes an auxiliary branch including a pair of substantially identical auxiliary input signal MOS transistors ($M_2$, $M_4$), each of whose gate electrodes is connected to a gate electrode of a different one of the separate signal transistors ($M_1$, $M_3$), each of whose drains is connected to a common-mode feedback node (14), and each of whose sources is connected to the drain of said common current-source transistor ($M_{10}$), the common-mode feedback node (14) being connected to an auxiliary load device ($M_6$) and to the gate electrode of a feedback MOS transistor $M_8$, the source of which is connected to the gate electrode of the common current-source transistor ($M_{10}$), and CHARACTERIZED FURTHER IN THAT the beta of each of the auxiliary signal input transistors ($M_2$, $M_4$) is substantially equal to one-half the beta of either of the signal input transistors ($M_1$, $M_3$).

A differential amplifier circuit as thus designed is useful in such applications as the input stage of an MOS operational amplifier (FIG. 3). Such an operational amplifier is useful in analog-to-digital (and digital-to-analog) converters and in switched-capacitor filters, as well as in semiconductor charge coupled device (CCD) filters and in other operational amplifier applications. In such an operational amplifier, for example, low power dissipation (3 milliwatt) and high open loop gain (60 dB), as well as high gain-bandwidth product (13 MHz) and high slew rate (20 V/$\mu$s), can be obtained with low equivalent input noise (11 $\mu$V RMS, 10 Hz to 10 KHz).

BRIEF DESCRIPTION OF THE DRAWING

This invention together with its features, advantages, and objects may be better understood from the following detailed description when read in conjunction with the drawings in which.

Figure 1:
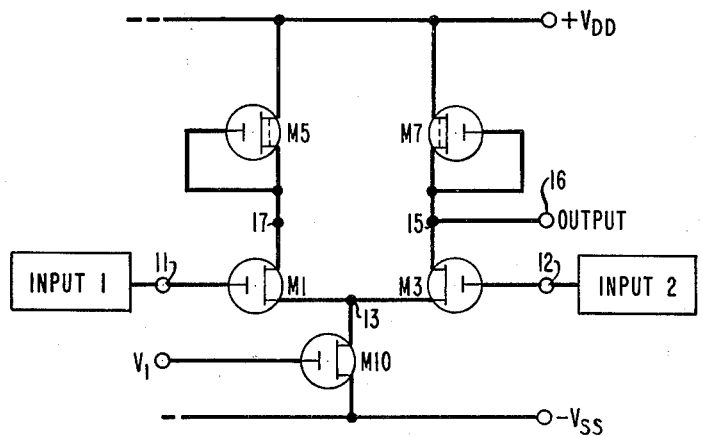
FIG. 1 is a schematic circuit diagram of a differential MOS amplifier circuit of the prior art.

Depletion mode transistors are indicated in the drawings by an extra dotted line across the channel of each of these transistors.

DETAILED DESCRIPTION

Figure 2:
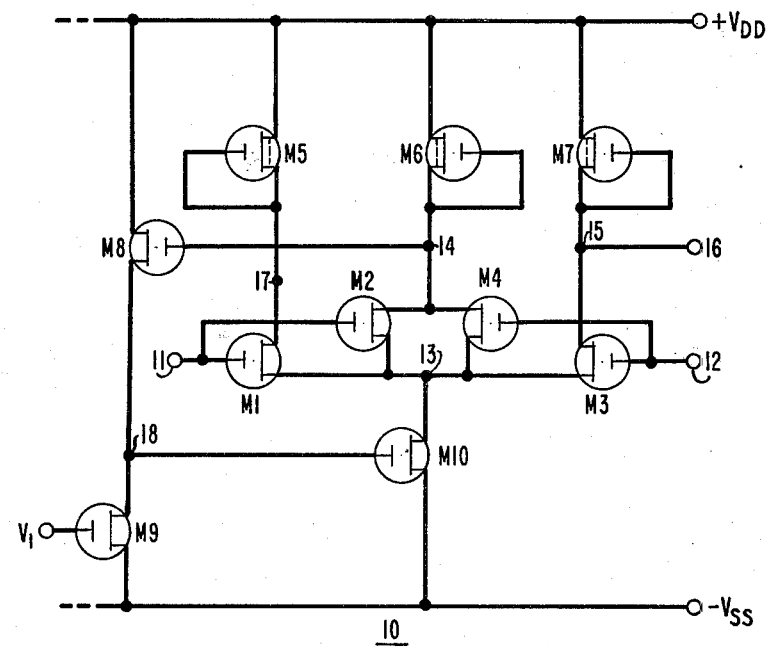
FIG. 2 is a schematic circuit diagram of a differential MOS amplifier circuit stage in accordance with a specific embodiment of the invention.

As shown in FIG. 2, a differential amplifier circuit stage 10 includes a pair of signal input terminals 11 and 12, and an output node 16. The input terminals 11 and 12 are connected to the gate electrodes of MOS transistors $M_1$ and $M_3$, respectively. The gate electrode of $M_3$ is connected to the gate electrode of an auxiliary MOS transistor $M_4$; whereas the gate electrode of $M_1$ is connected to the gate electrode of another auxiliary MOS transistor $M_2$. The sources of $M_1$, $M_2$, $M_3$, and $M_4$ are all connected to a common node 13 which is connected to the drain of MOS transistor $M_{10}$. The source of $M_{10}$ is connected to a source voltage supply terminal ($-V_{SS}$), of typically $-5$ volts of N-MOS technology. The drains of $M_2$ and $M_4$ are connected to a common-mode feedback node 14 which is connected to an auxiliary load device $M_6$ in the form of a MOS transistor whose source is connected to its gate electrode. The drains of $M_1$ and $M_3$, respectively, are connected to load devices $M_5$ and $M_7$, respectively, again in the form of MOS transistors (each substantially identical to $M_6$) whose sources are connected to their respective gate electrodes. The feedback node 14 is connected to the gate electrode of MOS transistor $M_8$ whose drain is connected to the drain voltage supply terminal $+V_{DD}$ and whose source is connected to the gate (control) electrode of MOS transistor $M_{10}$. This gate electrode of $M_{10}$ is also connected to the drain of MOS transistor $M_9$ whose gate electrode is connected to an intermediate voltage supply terminal $V_1$, that is, $V_1$ is intermediate between $V_{DD}$ and $-V_{SS}$. The source of $M_9$ is connected to the source voltage supply terminal $-V_{SS}$. Alternatively, $M_9$ and $V_1$ can be replaced by any suitable means for providing a convenient operating current through $M_8$. The source of $M_{10}$ is connected to the source voltage supply terminal ($-V_{SS}$), and the drain of $M_{10}$ is connected to node 13; thereby, $M_{10}$ acts as a current-source for the transistors $M_1$, $M_2$, $M_3$, and $M_4$.

The MOS transistors $M_5$, $M_6$, and $M_7$ advantageously are depletion mode devices, that is, their channels are all typically doped with extra donor impurities (N-MOS technology). The threshold voltage of these depletion mode devices is typically between about $-2$ volts and $-3$ volts under zero back-gate bias conditions (zero source-to-substrate voltage). All other transistors (FIG. 2) typically (but not necessarily) are enhancement mode devices, that is, having zero back-gate bias threshold voltages, typically of about $+0.25$ volts. As explained more fully below, it is a feature of the feedback loop furnished by $M_8$ that it maintains the proper operation of the differential amplifier circuit 10 regardless of the threshold voltages of $M_5$, $M_6$, $M_7$ so long as they are mutually the same and do not differ from $-2.8$ volts by more than about $\pm 1$ volt.

Advantageously, the $\beta$'s of the various transistors operating in saturation satisfy the relationships specified in equations (1) above. A convenient way of achieving this relationship is obtained by selecting $M_1$ and $M_3$ to be substantially identical to each other, the channel widths of $M_2$ and $M_4$ being one-half those of $M_1$ and $M_3$, so that $\beta_1 = \beta_3 = 2\beta_2 = 2\beta_4$ as in equations (2) above; and at the same time $M_5$, $M_6$, and $M_7$ are selected to be substantially identical to one another, so that $\beta_5 = \beta_6 = \beta_7$, again as in equations (2) above. It should be noted that during operation, all transistors in FIG. 1 are operated in their saturation regions, that is, with such a high drain voltage that the source-drain current does not change appreciably in response to reasonable changes in the drain-source voltage (high transconductance $g_m$ region).

The operation of the circuit 10 may be conveniently first described in the case where the signal input terminals 11 and 12 are both grounded (no-signal case). Because the loads $M_5$, $M_6$, and $M_7$ are identical, and because $\beta_2 + \beta_4 = \beta_1$, with $\beta_1 = \beta_3$; therefore, the currents in these loads are all the same, all being driven by the same current-source $M_{10}$. Accordingly, if these identical loads have the desired threshold voltage, then this current will have the desired value required for these loads to be in their saturation regions; conversely, if the loads do not have the desired threshold voltage, then this current will not have the desired value. In any event, however, the voltage at node 14 is the same as the voltage at node 15.

If the (equal) thresholds of $M_5$ and $M_7$ are too high (say, are all equal to $-2.5$ volts instead of a desired $-2.8$ volts), then the (equal) threshold of $M_6$ will also be equally too high, since all three of these transistors have been processed in the same fashion. Thus, the D-C resistance of these loads will be too high. Accordingly, during the initial transients, the voltage drop across these loads, including $M_6$, will initially be larger than desired. The voltage at node 14 and hence of the gate electrode of $M_8$ will thus be too low. As a result, the voltage of node 18 (located between $M_8$ and $M_9$) becomes too low also, thereby applying a lower voltage to the gate electrode of the current-source $M_{10}$. In response thereto, $M_{10}$ supplies a lower current to the loads $M_5$, $M_6$, and $M_7$. Accordingly, the current in $M_{10}$ is restored to the prescribed value suitable for the load transistors $M_5$, $M_6$, and $M_7$. The transistor $M_8$ thus supplies the required negative feedback to provide this stabilizing feature while the node 14 is directly sensing the undesired change of voltage caused by changes in the loads.

In converse manner, the negative feedback of $M_8$ counteracts too high a voltage at the node 14, caused by too low a threshold voltage of the load transistors, for example, $-3.1$ volts instead of the desired $-2.8$ volts.

On the other hand, if either or both of the input terminals 11 and 12 have signal applied to it, the voltage at node 14 will then be equal to the "common-mode" value, i.e., the arithmetic mean of the voltages at nodes 15 and 17. In such a case, if the common mode current goes low due to signals at terminals 11 and 12, the voltage at node 14 will also go high as before; therefore, the negative feedback feature of $M_8$ will restore the common mode current back to the no-signal value and hence restore the voltage at node 15 (and node 16) to the no-signal value, thus suppressing the common-mode gain of the stage.

Figure 3:
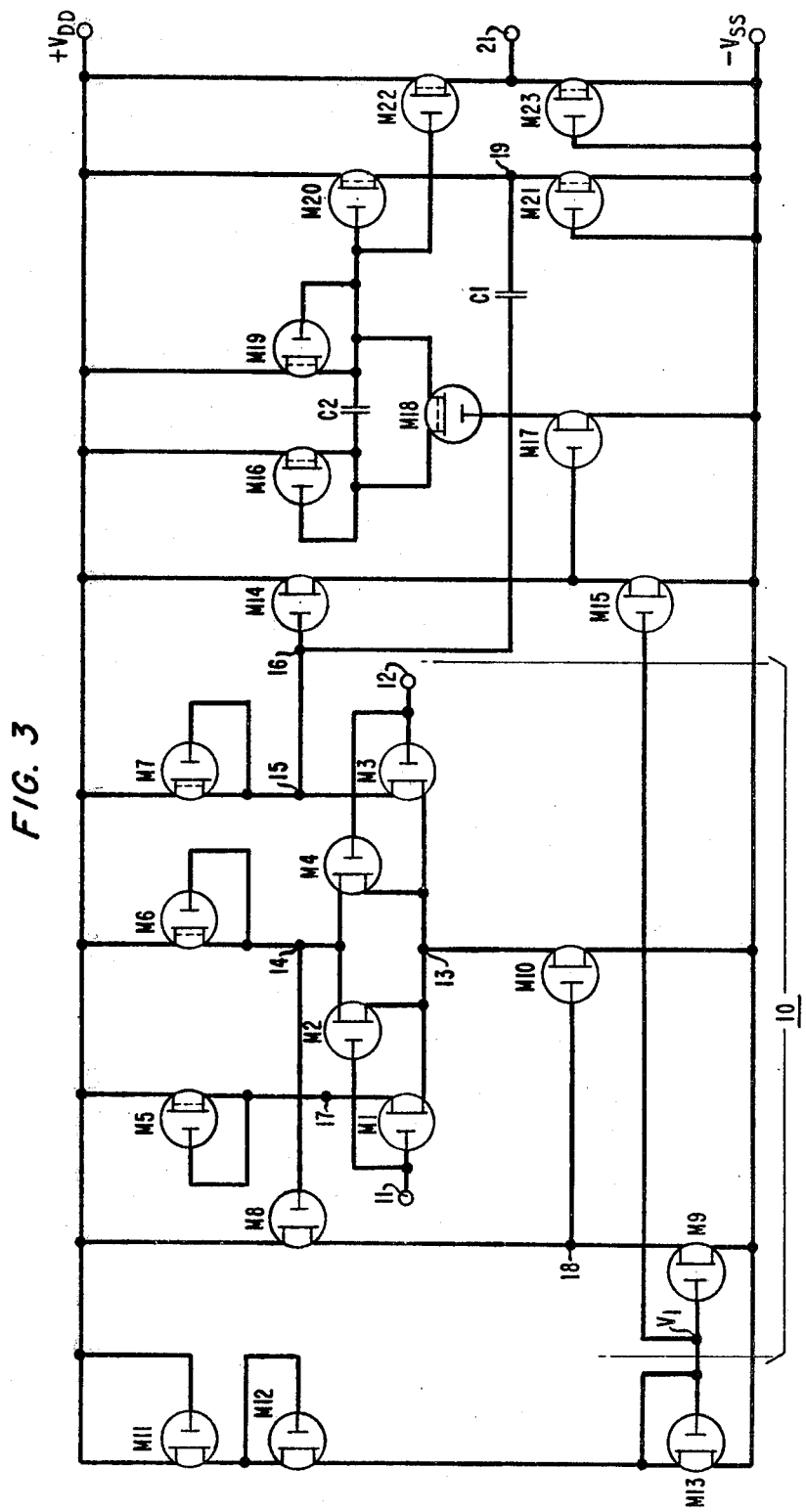
FIG. 3 is a schematic circuit diagram of an operational amplifier in N-MOS technology including a differential MOS amplifier stage in accordance with another specific embodiment of the invention.

FIG. 3 shows an MOS operational amplifier circuit with an input stage in accordance with the circuit 10 previously described in conjunction with FIG. 2. Elements in FIG. 3 which are the same as those in FIG. 2 are denoted by the same reference numerals.

The voltage $V_1$ (FIG. 2) applied to the gate electrode of $M_9$ is supplied in the circuit of FIG. 3 by means of the voltage division at node 18 furnished by a triplet of enhancement mode MOS transistors $M_{11}$ and $M_{12}$, $M_{13}$, the gate electrode of each of which is connected to the corresponding drain. The output of the input stage at terminal 16 serves as the input to a source follower including MOS transistors $M_{14}$ and $M_{15}$, forming a level shifter for input to the cascode arrangement of MOS transistors $M_{16}$, $M_{17}$, $M_{18}$, and $M_{19}$, where $M_{17}$ serves as a driver (current source) for the cascode. A feedback to node 16 is furnished by means of a "compensation" capacitor $C_1$ connected between the output (source) terminal 19 of a detecting MOS transistor $M_{20}$ and the node 16. The function of this compensation capacitor $C_1$ is to create a dominant pole in the response of the open loop gain, in order to provide low (unity) gain at frequencies corresponding to phase shifts of approximately 120 degrees and thereby to suppress oscillation when the amplifier is connected in unity gain feedback configurations. An additional capacitor $C_2$ reduces the required value of the capacitor $C_1$ to a reasonable value consistent with integrated MOS circuitry, that is, both $C_1$ and $C_2$ are now advantageously integrated circuit type MOS capacitors of reasonable size. In effect, the capacitor $C_2$ acts as a means for bypassing one of the cascode transistors ($M_{18}$) at high frequencies, thereby reducing the cascode gain and hence the required value of the capacitance of $C_1$. The output stage of the operational amplifier circuit of FIG. 3 is formed by an MOS transistor $M_{22}$ biased by a current-source MOS transistor $M_{23}$. Overall, this operational amplifier furnishes a single-ended output at an output terminal 21.

The (approximate) values for the parameters for the operational amplifier circuit shown in FIG. 3 may be illustratively selected as follows. The capacitance of $C_1$ of 0.5 picofarads, of $C_2$ is 0.3 picofarads; thus the total of $C_1 + C_2$ is only 0.8 picofarads. The semiconductor wafer substrate material in which the N-MOS devices are formed is typically p-type monocrystalline silicon of resistivity typically in the range of about 6 to 10 ohm-cm. The sources and drains, as well as the channels of the depletion mode transistors, are formed typically by arsenic ion implantation. The threshold voltage of all enhancement mode transistors ($M_1$, $M_2$, $M_3$, $M_4$, $M_8$, $M_9$, $M_{10}$, $M_{11}$, $M_{12}$, $M_{13}$, $M_{14}$, $M_{15}$, $M_{17}$) is typically about $+0.25$ volts; the threshold voltage of all depletion mode transistors ($M_5$, $M_6$, $M_7$, $M_{16}$, $M_{18}$, $M_{19}$, $M_{20}$, $M_{21}$, $M_{22}$, $M_{23}$) is typically about $-2.8$ volts, under zero source-to-substrate bias although this may vary from wafer to wafer due to processing variations (but is the same value on a single wafer). The values of channel width/length (W/L), as well as operating drain-source currents ($I_D$) and transconductances $g_m$, are illustratively as follows:

|  | W/L ($\mu m/\mu m$) | $I_D$ ($\mu A$) | $g_m$ ($\mu A/V$) |
| --- | --- | --- | --- |
| $M_1$, $M_3$ | 160/20 | 11.0 | 71.0 |
| $M_2$, $M_4$ | 80/20 | 5.5 | 35.5 |
| $M_5$, $M_6$, $M_7$ | 16/50 | 11.0 | 6.2 |
| $M_8$, $M_{14}$ | 8/80 | 14.6 | 7.9 |
| $M_9$, $M_{13}$, $M_{15}$ | 12/20 | 14.6 | 21.0 |
| $M_{10}$ | 24/20 | 33.0 | 44.5 |
| $M_{11}$ | 8/40 | 14.6 | 11.4 |
| $M_{12}$ | 8/80 | 14.6 | 7.9 |
| $M_{16}$ | 8/8 | 105. | 78.5 |
| $M_{17}$ | 22/8 | 112. | 135. |
| $M_{18}$ | 8/8 | 6.5 | 23.6 |
| $M_{19}$ | 8/50 | 6.5 | 6.8 |
| $M_{20}$ | 8/8 | 54.0 | 59.0 |
| $M_{21}$ | 8/14 | 54.0 | 40. |
| $M_{22}$ | 24/8 | 54.0 | 112. |
| $M_{23}$ | 8/14 | 54.0 | 40. |

It should be noted that further means for ensuring the equality of threshold voltages of the input signal transistors $M_1$, $M_2$, $M_3$ and $M_4$, and of the load transistors $M_5$, $M_6$, and $M_7$, is afforded by the use of a semiconductor wafer area averaging technique. For example, each of the load transistors $M_5$, $M_6$, and $M_7$ is divided into two equal segments, each segment of $M_5$ and $M_7$ located on an opposite side of the centrally located pair of mutually neighboring segments forming the auxiliary load transistor $M_6$. Similarly, with $M_2$ and $M_4$ each formed by a separate segment, the signal input transistors $M_1$ and $M_3$ can be segmented into two equal segments each and arranged on opposite sides of the centrally located pair of mutually neighboring segments forming $M_2$ and $M_4$. Other layout arrangements, including still further segmenting, can also be used.

Although this invention has been described in detail in conjunction with specific embodiments, various modifications can be made without departing from the scope of the invention. For examples, P-MOS technology can be used instead of N-MOS, and other or different voltage supplies may be used than described above in detail. Also, depletion mode transistor may be used instead of the enhancement mode transistor. Moreover, other intermediate and output stages can also be used than those described.

I claim:

1. An MOS differential amplifier circuit including a pair of substantially identical branches, each branch having a separate signal input MOS transistor ($M_1$, $M_3$) in series with a separate MOS load transistor ($M_5$, $M_7$), both branches being connected to the drain of a common current-source MOS transistor ($M_{10}$), CHARACTERIZED IN THAT said circuit further includes an auxiliary branch including a pair of substantially identical auxiliary input signal MOS transistors ($M_2$, $M_4$), each of whose gate electrodes is connected to a gate electrode of a different one of the separate signal transistors ($M_1$, $M_3$), each of whose drains is connected to a common-mode feedback node (14), and each of whose sources is connected to the drain of said common current source transistor ($M_{10}$), the common-mode feedback node (14) being connected to an auxiliary load device ($M_6$) and to the gate electrode of a feedback MOS transistor ($M_8$), the source of which is connected to the gate electrode of the common current-source transistor ($M_{10}$).

2. The circuit of claim 1 FURTHER CHARACTERIZED IN THAT the beta of each of the auxiliary input signal transistors ($M_2$, $M_4$) is substantially equal to one-half the beta of either of the signal input transistors ($M_1$, $M_3$).

3. Semiconductor apparatus comprising:
 (a) a first MOS transistor whose gate electrode is connected to the gate electrode of a second MOS transistor;
 (b) a third MOS transistor whose gate electrode is connected to the gate electrode of a fourth MOS transistor;
 (c) a fifth MOS transistor whose source is connected to the drain of the first MOS transistor;
 (d) a sixth MOS transistor whose source is connected to the drains of the second and fourth transistors;
 (e) a seventh MOS transistor whose source is connected to the drain of the third MOS transistor;
 (f) a common electrical current-source device having an output node connected to the sources of said first, second, third, and fourth transistors.

4. Apparatus according to claim 3 which further includes a negative feedback loop connected between the drains of the second and fourth transistors and a control terminal of the common electrical current-source device, and in which the drains of the fifth, sixth, and seventh transistors are connected to a common drain voltage source terminal.

5. Apparatus according to claim 3 or 4 in which said first, second, third, and fourth transistors are enhancement mode transistors and said fifth, sixth, and seventh transistors are depletion mode transistors.

6. Apparatus according to claim 5 in which the beta's $\beta_1$, $\beta_2$, $\beta_3$, $\beta_4$, $\beta_5$, $\beta_6$, and $\beta_7$, respectively, of said first, second, third, fourth, fifth, sixth, and seventh transistors substantially satisfy the relationships:

$$\beta_1 \cdot \beta_3 \cdot (\beta_2 + \beta_4) = \beta_5 \cdot \beta_7 \cdot \beta_6.$$

7. Apparatus according to claim 6 in which said beta's substantially further satisfy the relationships:

$$\beta_1 = \beta_3 = 2\beta_2 = 2\beta_4.$$

8. Apparatus according to claim 7 in which said common electrical current-source device comprises a separate MOS transistor whose said control terminal is its gate electrode, and in which said feedback loop includes a feedback transistor whose gate electrode is connected to the drains of the second and fourth transistors.

9. Apparatus according to claim 3 or 4 in which the gate electrode of each of the fifth, sixth, and seventh transistors is connected to the source, repectively, of the said fifth, sixth, and seventh transistors.

10. Apparatus according to claim 9 in which the beta's $\beta_1$, $\beta_2$, $\beta_3$, $\beta_4$, $\beta_5$, $\beta_6$, and $\beta_7$ of said first, second, third, fourth, fifth, sixth, and seventh transistors substantially satisfy the relationships:

$$\beta_1 \cdot \beta_3 \cdot (\beta_2 + \beta_4) = \beta_5 \cdot \beta_7 \cdot \beta_6.$$

11. Apparatus according to claim 10 in which said beta's substantially further satisfy the relationships:

$$\beta_1 = \beta_3 = 2\beta_2 = 2\beta_4.$$

12. Apparatus according to claim 11 in which said common electrical current-source device comprises a separate MOS transistor whose said control terminal is its gate electrode, and in which said feedback loop includes a feedback transistor whose gate electrode is connected to the drains of the second and fourth transistors.

13. Semiconductor apparatus comprising:
 (a) first and second MOS transistors whose gate electrodes are connected together to a first signal input terminal, the beta of the second transistor being substantially one-half that of the first transistor;
 (b) third and fourth MOS transistors whose gate electrodes are connected together to a second signal input terminal, the beta of the fourth transistor being substantially one-half that of the third transistor and being substantially the same as that of the second transistor;
 (c) first connecting means for electrically connecting together the sources of said first, second, third, and fourth transistors to an output terminal of an electrical current source;
 (d) fifth, sixth, and seventh depletion mode MOS transistors, all of substantially the same beta, whose drains are connected together to a drain voltage source terminal and each of whose sate electrodes is connected to its source;
 (e) second connecting means for electrically connecting the drains of the second and fourth transistors to a feedback input terminal and to the source of the sixth transistor;
 (f) third connecting means for electrically connecting the drain of the first transistor to the source of the fifth transistor; and
 (g) fourth connecting means for electrically connecting the drain of the third transistor to the source of the seventh transistor.

14. Apparatus according to claim 13 further comprising an eighth MOS transistor whose gate electrode is connected to said feedback input terminal and whose source is connected to a control terminal of the current-source.

15. Apparatus according to claim 13 or 14 in which the first, second, third, and fourth transistors are enhancement mode MOS transistors.

* * * * *

UNITED STATES PATENT AND TRADEMARK OFFICE
CERTIFICATE OF CORRECTION

PATENT NO. : 4,213,098

DATED : July 15, 1980

INVENTOR(S) : Yannis Tsividis

It is certified that error appears in the above-identified patent and that said Letters Patent are hereby corrected as shown below:

Column 1, line 52, "resistors" should read --transistors--.
Column 8, line 48, "sate" should read --gate--.

Signed and Sealed this

Seventh Day of April 1981

[SEAL]

Attest:

RENE D. TEGTMEYER

Attesting Officer

Acting Commissioner of Patents and Trademarks